United States Patent
Ling

(10) Patent No.: US 6,686,787 B2
(45) Date of Patent: Feb. 3, 2004

(54) HIGH-SPEED FULLY BALANCED DIFFERENTIAL FLIP-FLOP WITH RESET

(76) Inventor: Kuok Ling, 24201 Park Granada, Calabasas, CA (US) 91302

( * ) Notice: Subject to any disclaimer, the term of this patent is extended or adjusted under 35 U.S.C. 154(b) by 73 days.

(21) Appl. No.: 10/090,593

(22) Filed: Feb. 28, 2002

(65) Prior Publication Data

US 2003/0160644 A1 Aug. 28, 2003

(51) Int. Cl.[7] .............................................. H03K 3/289
(52) U.S. Cl. ...................... 327/203; 327/217; 327/218
(58) Field of Search ................................ 327/202, 203, 327/208, 210, 211–215, 217–219, 57

(56) References Cited

U.S. PATENT DOCUMENTS

| | | | | |
|---|---|---|---|---|
| 5,216,295 A | * | 6/1993 | Hoang | 327/203 |
| 6,140,845 A | | 10/2000 | Benachour | 327/57 |
| 6,433,595 B1 | * | 8/2002 | Tung et al. | 327/115 |

* cited by examiner

*Primary Examiner*—Terry D. Cunningham
*Assistant Examiner*—Long Nguyen
(74) *Attorney, Agent, or Firm*—Lance Kreisman

(57) ABSTRACT

A differential D flip-flop is disclosed including respective master and slave cells. The master cell comprises a first data set circuit and a first data store circuit. The data set circuit has a first differential input and a first differential output. The first data store circuit couples to the output of the first data set circuit. The cell further includes a differential clock circuit and a differential reset circuit. The clock circuit having complementary clock inputs to alternately set and store data in the data set and data store circuits. The differential reset circuit ties to the differential output and is operative in response to a reset signal to force the differential output to a predetermined logic level. The differential reset circuit includes matched complementary reset drivers to exhibit like capacitances. The slave cell is formed substantially similar to the master cell, and includes a second differential input coupled to the first differential output of the master cell.

8 Claims, 3 Drawing Sheets

HIGH-SPEED FULLY BALANCED DIFFERENTIAL FLIP-FLOP WITH RESET

FIELD OF THE INVENTION

The invention relates generally to digital electronic circuitry, and more particularly differential D flip-flop circuits.

BACKGROUND OF THE INVENTION

Differential D flip-flops provide an important fundamental building block for digital systems. In some applications, differential D flip-flops provide a temporary storage function. In other applications, such as automatic test equipment, differential D flip-flops provide a way to synchronize differential tester data signals with timing signals.

As illustrated in FIG. 1, a conventional D-type differential flip-flop 10 typically includes respective master and slave cells 11 and 20. The master cell employs a data set circuit 12 that receives differential data on the application of a first clock edge to the input of a clock input circuit 14. On a subsequent edge of the clock signal, the data from the data set circuit is loaded and temporarily stored in a data store circuit 16. On the next clock edge, the data in the data store circuit is provided as the differential input data for the slave cell 20. The slave cell is constructed similar to the master cell 10, with its data set circuit receiving the output from the master cell and generating the differential output for the flip-flop. A more detailed description of this conventional construction is provided in U.S. Pat. No. 6,140,845 to Benachour.

For automatic test equipment applications, the clock input circuit 14 receives signals from a fractionally delayed clock known as a timing generator (not shown). For this application it is useful to include a reset circuit 18 in the differential D flip-flop described above. The reset feature provides the ability to force the differential output to a predetermined logic level. Conventionally, as shown in FIG. 2, reset circuitry typically includes several transistor switches QRS1–QRS4, to couple the differential output OUT, OUT* to a pullup/pulldown circuit 22.

While the conventional reset circuitry works well for relatively low-speed applications up to around 100 MHz, at higher frequencies the differential flip-flop tends to exhibit imbalances (i.e. output signal rise/fall times) in the output due to capacitive effects associated with the reset circuitry. Moreover, due to the large number of transistors employed to carry out the conventional reset function, the performance of the conventional differential D flip-flop is compromised.

What is needed and currently unavailable is a differential D flip-flop with reset capability that maintains a balanced differential output at high frequencies and maximizes performance. The differential flip-flop of the present invention satisfies these needs.

SUMMARY OF THE INVENTION

The high-speed differential D flip-flop of the present invention provides reset capability while maintaining a balanced differential output at high frequencies. Moreover, the reset capability is carried out with minimal circuitry to maximize circuit performance and reduce power dissipation and silicon area.

To realize the foregoing advantages, the invention in one form comprises a differential D flip-flop including respective master and slave cells. The master cell comprises a first data set circuit and a first data store circuit. The data set circuit has a first differential input and a first differential output. The first data store circuit couples to the input of the first data set circuit. The cell further includes a differential clock circuit and a differential reset circuit. The clock circuit having complementary clock inputs to alternately set and store data in the data set and data store circuits. The differential reset circuit is tied to the differential output and is operative in response to a reset signal to force the differential output to a predetermined logic level. The differential reset circuit includes matched complementary reset driver transistors to exhibit like parasitic capacitances. The slave cell is formed substantially similar to the master cell, and includes a second differential input coupled to the first differential output of the master cell.

In another form, the invention comprises a timing circuit responsive to pattern timing data for use in automatic test equipment. The timing circuit includes a system clock for generating clock pulses of a predefined width and a differential D flip-flop. The differential D flip-flop has a timing data input to receive the pattern timing data, a clock input coupled to the system clock, an output, and a reset circuit. The reset circuit includes a reset input that is responsive to a reset signal to force the flip-flop output to a predetermined state. The timing circuit further includes a delay element coupled to the differential D flip-flop output and the differential D flip-flop reset input.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

The differential flip-flop of the present invention provides a reset capability while maintaining a balanced differential output at high frequencies. This is accomplished by employing reset circuitry that includes matching reset drivers having like capacitances. By ensuring matched capacitive loading on the differential output, a balanced differential output is achieved for a higher operation speed.

Figure 1:
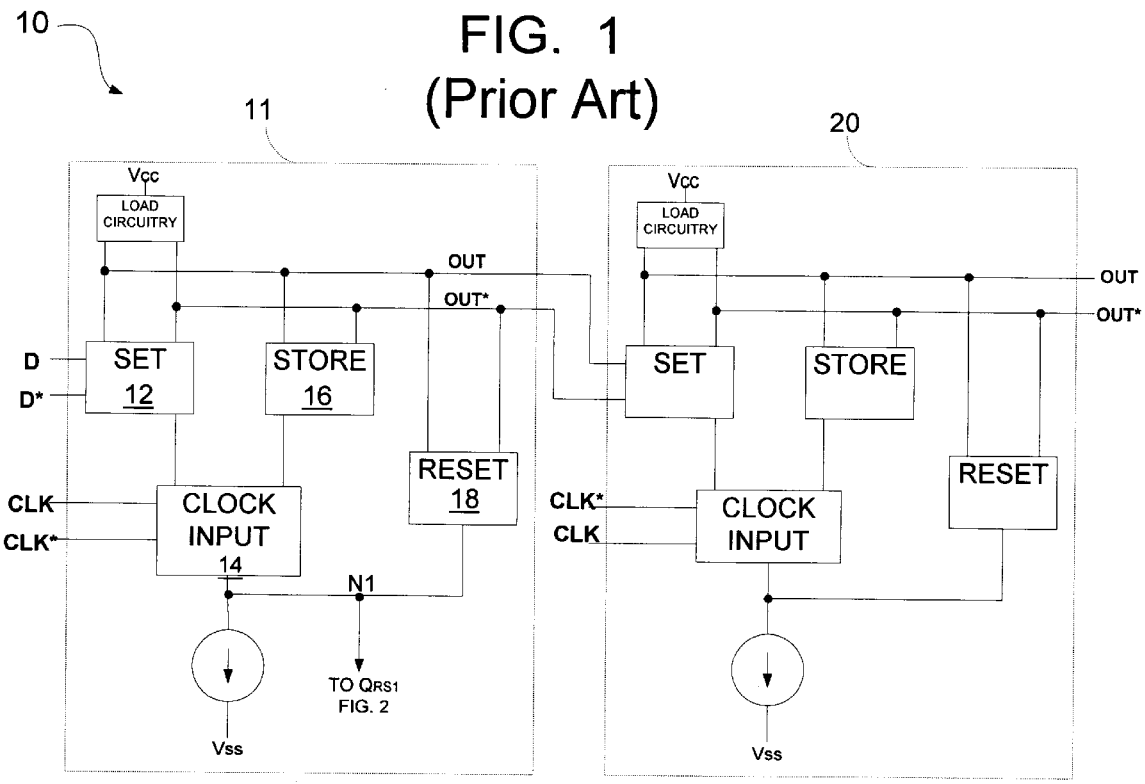
FIG. 1 is a high-level block diagram of a conventional differential flip-flop.
Figure 2:
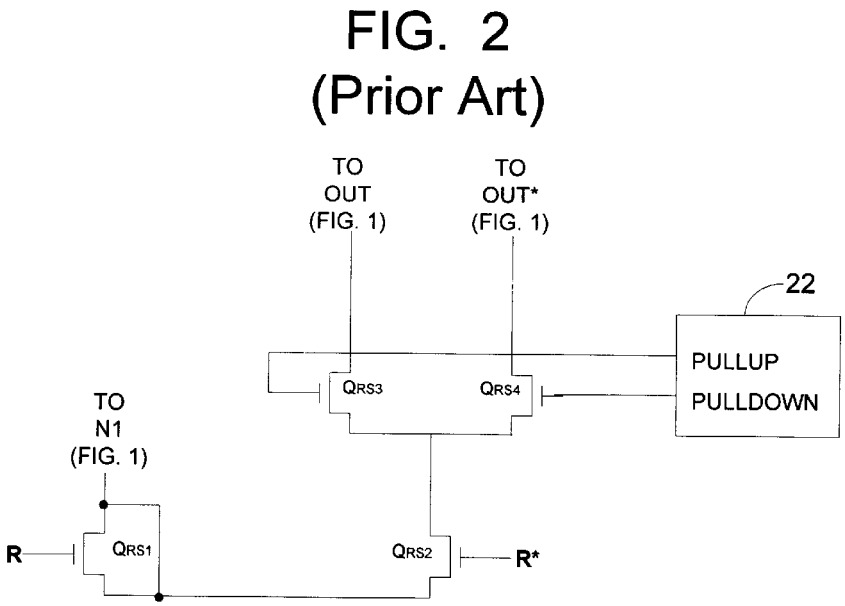
FIG. 2 is a partial schematic view of the conventional reset circuitry of FIG. 1.
Figure 3:
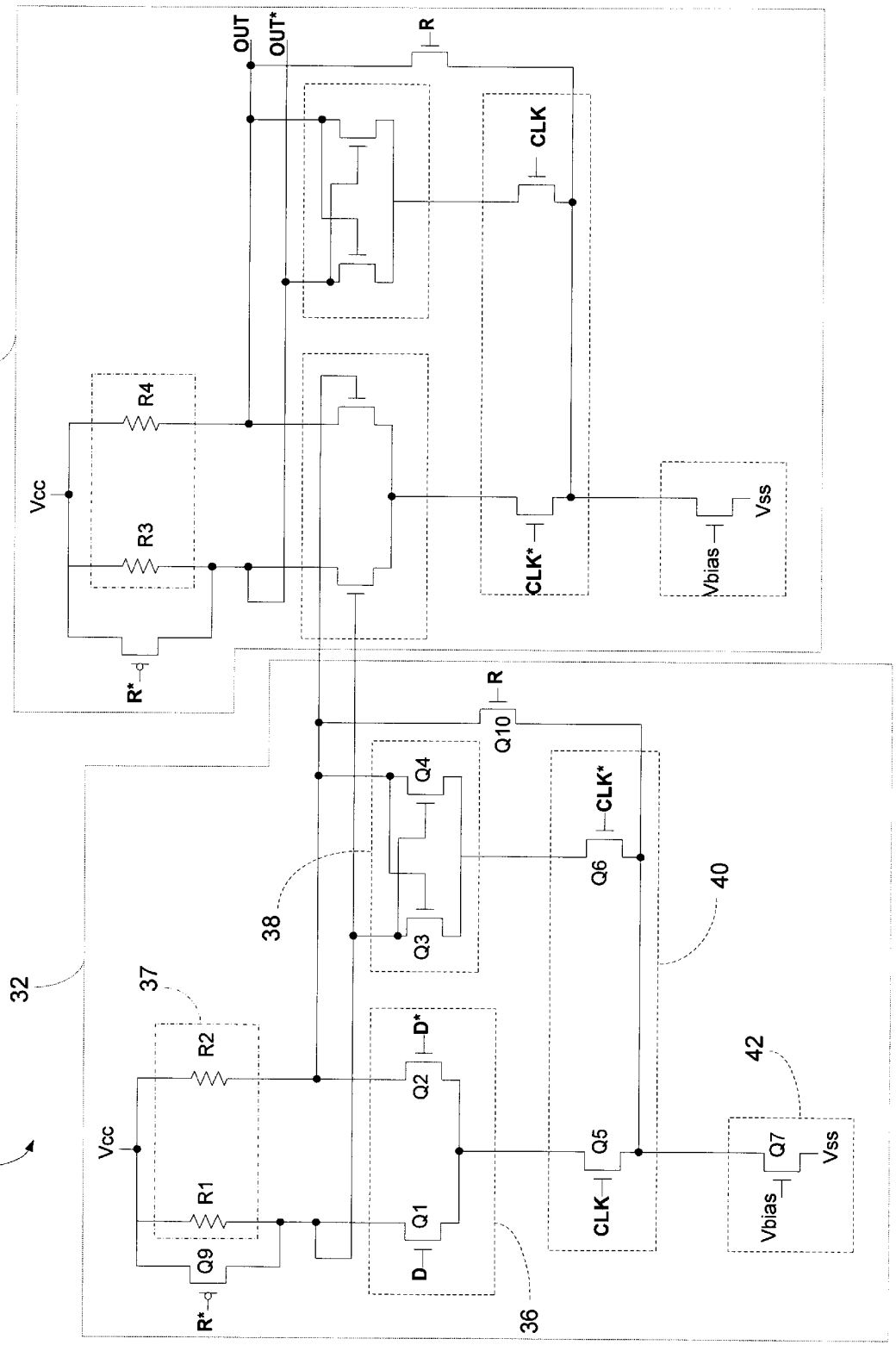
FIG. 3 is a schematic illustration of a differential flip-flop according to one form of the present invention.

Referring now to FIG. 3, the differential flip-flop according to one form of the present invention, generally designated 30, is of the "D" type and includes respective master and slave cells 32 and 34. The cells are formed similarly and are disposed in a cascaded configuration such that the output of the master cell provides the input to the slave cell. For purposes of clarity, only the master cell 32 will be described in detail.

With further reference to FIG. 3, the master cell 32 includes data set circuitry 36 comprising a differential pair of MOS transistors Q1 and Q2 with complementary data inputs D and D*. These inputs serve as the flip-flop differential data inputs. Load circuitry 37 taking the form of several MOS transistors (not shown, but represented by R1 and R2) and the positive voltage supply source Vcc coupled to the drain terminals of the data set transistors to set an appropriate differential output signal at the cell differential output OUT and OUT*.

Tapping into the data set source terminals is a pair of cross-coupled MOS transistors Q3 and Q4 configured to form a data store circuit 38. Each gate of the data store transistors couples to the opposite-drain terminal, with both source terminals interconnected.

Add Further referring to FIG. 3, both the data set circuit 36 and the data store circuit 38 are responsive to a clock input circuit 40 comprising complementary transistors Q5 and Q6. Transistor Q5 includes a positive clock input CLK and a drain terminal tied to the data set transistor source terminals. A similar configuration is employed for transistor Q6, but with an inverted clock input CLK*. The master cell circuitry is biased by a current source 42, comprising MOS transistor Q7 driven by bias voltage Vbias. In automatic test equipment applications, timing signals in the form of a fractionally delayed differential signal drive the clock input circuitry 40.

To provide the ability to force the differential output to a predetermined logic level without imbalance in the differential output, the present invention employs unique reset circuitry. The inventor has discovered that if the reset circuitry in each path of the differential output provides a similar capacitive load, and operates under similar parameters, then the output remains balanced under high frequency operations.

To achieve optimum performance and accuracy in the differential output, the reset circuitry comprises a pair of similarly matched complementary MOS transistors Q9 and Q10 configured to operate in the same mode. The PMOS reset transistor Q9 is disposed across the load resistor R1 to directly couple Vcc to the negative differential output OUT* in response to a reset signal R*. The NMOS reset transistor Q10 couples the positive output OUT to Vss in response to a reset signal R, complement of R*.

With only a single transistor disposed in each reset path, the level of parasitic capacitance in the path will be low, enabling the reset driver to force the output to the desired state much faster than that realized conventionally. This "strength" in the ability of the reset drivers is magnified when matching the transistors in terms of size and/or operating modes, thereby achieving maximum pull-up/pull-down ability on the differential flip-flop output.

As noted above, the slave cell 34 is configured substantially similar to the master cell 32, with respective data inputs receiving the differential output from the master cell; however, the polarity of the slave clock input is opposite of that of the master cell. The outputs of the slave cell OUT and OUT* provide the output for the flip-flop 30.

In operation, the input data is passed (i.e. clocked) to the output of the master cell 30 when CLK goes from a logic low to a logic high level, and subsequently latched and stored into data store 38 when CLK goes back to a logic low level; changes in the input data will not affect the output of the master cell at this stage since it has been successfully stored in data store 38. At the same time that data is latched into data store 38 in the master cell, it is also being passed to the output of the slave cell, i.e. the output of the flip-flop. On the subsequent low to high transition of the CLK signal the output data is latched and stored in data store of the slave cell, which completes the data transfer from the input to the output of the D flip-flip. The differential reset signal R and R*, when asserted any time, will put the output OUT in a logic low state and output OUT* in a logic high state.

The inclusion of the reset ability allows the differential D flip-flip to be used not only in the synchronization of timing data to the automatic test equipment's system clock, it also allows it to be used to generate formatted timing waveforms to perform integrated circuit testing.

Figure 4:
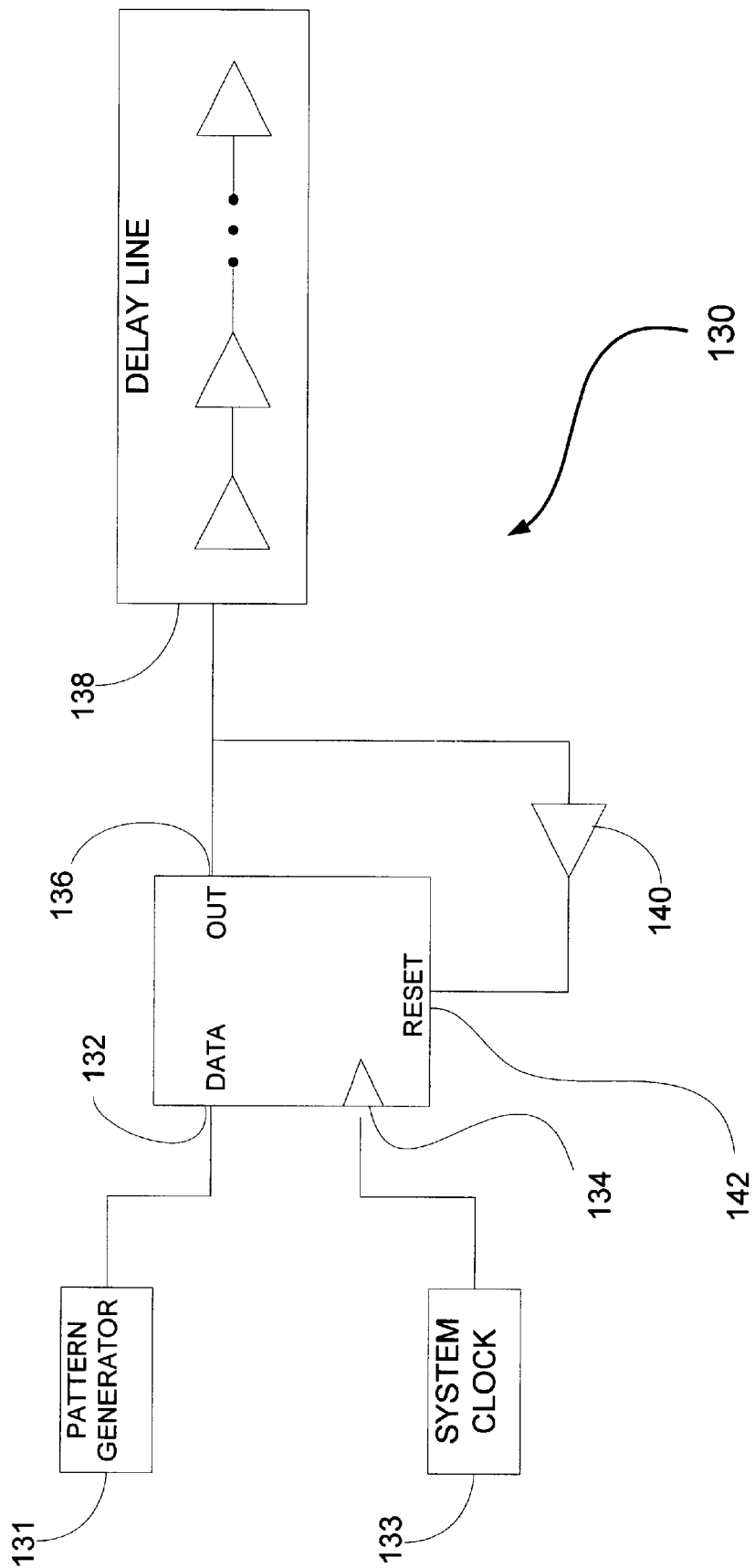
FIG. 4 is a block diagram of a timing circuit employing the differential D flip flop of FIG. 3.

In another application, the differential D flip-flop of the present invention may be beneficially employed at the front end of a timing generation circuit 130, as illustrated in FIG. 4. In this embodiment (shown as a single-ended configuration for clarity, rather than differential), timing data DATA from a pattern generator 131 is fed to the flip-flop data input, at 132, with the system clock 133 fed to the flip-flop clock input, at 134. The synchronized output of the flip-flop drives a delay line 138. Signals from the flip-flop output 136 are then fed back through a delay buffer 140 to a reset input, at 142, to reset the output. In this manner, the width of the output pulse can be minimized to the combined delays of the flip-flop and delay buffer. Stated differently, the width of the timing output pulse is independent of the width of the data input pulse. The amount of delay in the buffer 140 can also be made programmable to offer further pulse width control. This is very advantageous for timing signals to ensure a fast refire capability.

Those skilled in the art will appreciate the many benefits and advantages afforded by the present invention. Of significant importance is the matching of the reset drivers (reset and its complement) to achieve an optimum balance in the differential output of the flip-flop. Moreover, by employing minimal circuitry in the form of a single driver in each reset path to carry out the reset function, the performance of the flip-flop is maximized.

While the invention has been particularly shown and described with reference to the preferred embodiments thereof, it will be understood by those skilled in the art that various changes in form and detail may be made therein without departing from the spirit and scope of the invention. For example, while the differential flip-flop has been described herein as having a single reset driver (for both the R and R* paths), it should be understood that the single driver may encompass a single transistor, or multiple transistors in parallel to effect the desired reset functionality with low resistance.

What is claimed is:

1. A differential flip-flop including:
    a master cell comprising
        a first data set circuit having a first differential input and a first differential output,
        a first data store circuit coupled to the output, of the first data set circuit,
        a differential clock circuit having complementary clock inputs to alternately set and store data in the first data set and first data store circuits, and
        a differential reset circuit tied to the differential output and operative in response to a reset signal to force the differential output to a predetermined logic level, the differential reset circuit including matched complementary reset driver circuitry; and
    a slave cell formed substantially similar to the master cell, the slave cell having a second differential input coupled to the first differential output of the master cell.

2. A differential flip-flop according to claim 1 wherein:
    the matched complementary reset driver circuitry includes a reset driver path and a reset complement driver path, both paths having matched capacitances.

3. A differential flip-flop according to claim 2 wherein:
    the reset driver and complementary driver paths each include a single driver.

4. A differential flip-flop according to claim 3 wherein:

each single driver comprises a single transistor.

5. A differential flip-flop according to claim 1 wherein:

the matched complementary reset driver circuitry comprises circuits operating at matching parameters.

6. A differential flip-flop according to claim 1 wherein:

the matched complementary reset driver circuitry comprises transistors having matched sizes.

7. A differential flip-flop according to claim 1 wherein:

the differential reset circuit includes an input responsive to a logic signal, and an output directly coupled to the differential output.

8. A differential flip-flop according to claim 1 wherein:

each of the matched complementary reset drivers comprises a single transistor.

\* \* \* \* \*